United States Patent
Abe et al.

(10) Patent No.: US 6,727,581 B2
(45) Date of Patent: Apr. 27, 2004

(54) SEMICONDUCTOR MODULE

(75) Inventors: Ryo Abe, Hyogo (JP); Takayuki Miyamoto, Hyogo (JP)

(73) Assignee: Renesas Technology Corp., Tokyo (JP)

(*) Notice: Subject to any disclaimer, the term of this patent is extended or adjusted under 35 U.S.C. 154(b) by 22 days.

(21) Appl. No.: 10/242,691

(22) Filed: Sep. 13, 2002

(65) Prior Publication Data

US 2003/0183925 A1 Oct. 2, 2003

(30) Foreign Application Priority Data

Apr. 2, 2002 (JP) ........................................ 2002-099633

(51) Int. Cl.[7] ............................................... H01L 23/34
(52) U.S. Cl. ........................ 257/723; 257/686; 257/724
(58) Field of Search ................................. 257/777, 686, 257/48, 723, 724, 778, 784

(56) References Cited

U.S. PATENT DOCUMENTS 4,721,995 A * 1/1988 Tanizawa
6,002,178 A * 12/1999 Lin

FOREIGN PATENT DOCUMENTS

JP 08-153846 6/1996
JP 10-256474 9/1998

* cited by examiner

*Primary Examiner*—Sheila V. Clark
(74) *Attorney, Agent, or Firm*—McDermott, Will & Emery

(57) ABSTRACT

In a case that a bare chip has been detected as being defective from among bare chips, a good chip is mounted to the rear surface of the surface wherein the bare chips are provided to a semiconductor module substrate so that a QFC pin of the bare chip is fixed at the ground potential (GND). Thereby, the bare chip stops the output of a signal to the input/output terminals or the input of a signal from the input/output terminals. As a result, the good chip outputs an electrical signal to the input/output terminals or an electrical signal is inputted from the input/output terminals. Thereby, a semiconductor module is gained that can be repaired even in the case that a defective chip is detected after the chip has been molded into a mold resin.

8 Claims, 9 Drawing Sheets

SEMICONDUCTOR MODULE

BACKGROUND OF THE INVENTION

1. Field of the Invention

The present invention relates to a semiconductor module wherein a semiconductor chip is mounted on a module substrate.

2. Description of the Background

A semiconductor memory device is, in many cases, utilized in a personal computer, a workstation or the like. In addition, in recent years the speed, degree of compactness and number of functions of personal computers have increased and, therefore, semiconductor memory devices have been required to further increase their memory capacity. In addition, the market has expanded so that a large number of low-cost memory devices are used. Therefore, further increase in the capacity of, and further reduction in costs of, semiconductor memory devices have become required.

The number of DRAMs (Dynamic Random Access Memory), from among the above described semiconductor memory devices utilized in personal computers or the like has increased because it is advantageous from the point of view of cost per bit unit. Cost per bit unit can be reduced by increasing the diameter of wafers even in the case that the capacity is increased and, therefore, DRAMs are frequently utilized.

In a DRAM, however, cost of development, cost for high level institutions and the like have greatly increased together with the increase in the testing period of time and test costs accompanying the increase in capacity as well as the enhancement of microscopic processing technology so that whether or not those costs can be reduced has become a problem.

The bit configuration for the input to or output from a DRAM is conventionally 4 bits, 8 bits or 16 bits and, therefore, the variety in types of bit numbers is small so that one module is made up of a plurality of DRAMs for general utilization. Thus, a semiconductor memory device such as a DRAM is, in many cases, utilized in a module condition.

FIGS. 9 and 10 show an example of a conventional semiconductor module (memory module). The conventional semiconductor module has a structure, wherein single chips 117, in which bare chips 101, mounting islands 104, bonding wires 105 and lead frames 110 are molded into mold resin 108, are mounted on a semiconductor module substrate 102, such as of an SOP (Small Outline Package) or a TSOP (Thin Small Outline Package) corresponding to a surface mounting technology wherein parts can be mounted on both sides of a printed circuit board.

In addition, development has progressed of a memory package having a basic tendency toward miniaturization and thinning together with enhancement of performance and of functions of a memory chip. Then, though an insertion system has been adopted for a memory package, in recent years the forms of packages have greatly changed such that a surface mounting system has started to be adopted.

At present, the surface mounting system has become the main trend in place of the insertion system and further miniaturization and lightening of a package are strongly required. Up to the present, simplification of design and increase in reliability, as well as reduction in cost, have been achieved by utilizing a semiconductor module.

In addition, in a conventional manufacturing process of a semiconductor module, in the case that a defective chip is discovered in a module test after the manufacture of a semiconductor module, testing and replacement of such a defective chip are carried out until such defect has been removed.

As described above, there is a problem with the conventional semiconductor module wherein a plurality of single memory chip ICs (Integration Circuits) in the form of packaged single chips 117 is mounted to semiconductor module substrate 102, as shown in FIG. 9, and, therefore, the mounting area of the single memory chip ICs becomes large.

In addition, there is a problem wherein a great amount of time and effort are required for the replacement of a memory chip that has been detected as being defective according to the conventional manufacturing process of a semiconductor module. Furthermore, though there is a memory module in the form of a COB (Chip On Board) as a semiconductor module with which high density mounting can easily be carried out, there is a problem wherein a bare chip that has been detected as being defective cannot be repaired after bare chips have been sealed into mold resin according to the conventional module in the form of a COB.

SUMMARY OF THE INVENTION

A first object of the present invention is to provide a semiconductor module wherein, bare chips other than a bare chip that has become defective from among a plurality of bare chips can be effectively utilized by newly mounting a good chip even in the case that the chip defect is detected after the chips have been molded into mold resin. In addition, a second object is to achieve high concentration mounting in a semiconductor module by integrally molding a plurality of bare chips provided on a semiconductor module substrate.

A semiconductor module of the present invention is provided with a semiconductor module substrate, a plurality of bare chips mounted on the main surface of the semiconductor module substrate, and a mold resin for covering the plurality of bare chips together with the main surface of the semiconductor module substrate. In addition, the semiconductor module of the present invention includes a plurality of repair chip mounting regions provided outside of the mold resin, which are regions wherein repair chips having input/output terminals that can be utilized in place of the plurality of bare chips, respectively, can be mounted. In addition, the semiconductor module of the present invention includes a plurality of electrical wires that is connected to the input/output terminals of the mounted repair chip(s) for inputting or outputting electrical signals that have been inputted to, or outputted from, the bare chip(s) that has (have) been detected as being defective via these input/output terminals to the mounted repair chip(s) in the case that any of the plurality of bare chips has been detected as being defective and (a) repair chip(s) has (have) been mounted on any of the plurality of repair chip mounting regions.

According to the above described configuration, a repair chip can be mounted to any of the plurality of repair chip mounting regions in place of a bare chip that has become defective from among the plurality of bare chips, thereby the semiconductor module can be repaired after the bare chips are sealed in the resin. Therefore, bare chips other than the bare chip that has become defective from among the plurality of bare chips can be effectively utilized.

In the semiconductor module of the present embodiment, the plurality of bare chips, respectively, may be formed so that it is possible to stop the functions inside of the plurality of bare chips, respectively, by a predetermined unit. In addition, the module of the present invention may be formed so that the electrical signals that have been outputted from the bare chip detected as being defective are outputted from a repair chip and the electrical signals that have been inputted to the bare chip are inputted to the repair chip in the case that the repair chip has been mounted on the semiconductor module substrate and the function of the bare chip has been stopped by the predetermined unit.

According to the above described configuration, the function of a bare chip can be stopped by a predetermined unit and, therefore, conflicts of signals due to unnecessary signal input/output can be prevented and power consumption waste can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, in reference to FIGS. 1 to 7, a semiconductor module of an embodiment of the present invention that can be repaired after the bare chips are covered with a mold resin will be described.

In the semiconductor module of the present embodiment, in the case that a bare chip in the mold is detected as being defective, a repair chip that can be substituted for this bare chip is mounted on the semiconductor module substrate and, thereby, the semiconductor module of the present embodiment is repaired.

Figure 1:
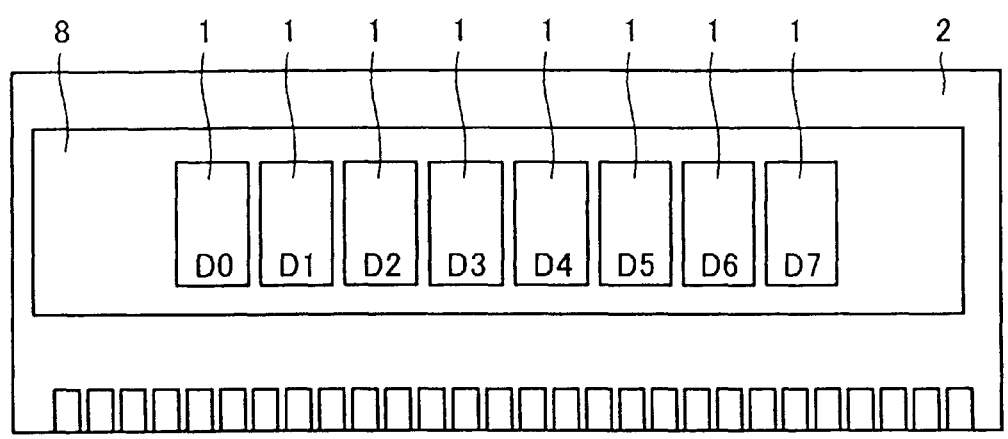
FIG. 1 is a view showing a condition wherein a plurality of bare chips mounted on a semiconductor module substrate is integrally molded into a mold resin in a semiconductor module of an embodiment.

FIG. 1 shows the semiconductor module of the embodiment. As shown in FIG. 1, in the semiconductor module of the embodiment, a plurality of bare chips 1 are mounted directly on one of the main surfaces of a semiconductor module substrate 2 and the plurality of bare chips 1 are integrally molded into a mold resin 8.

Figure 2:
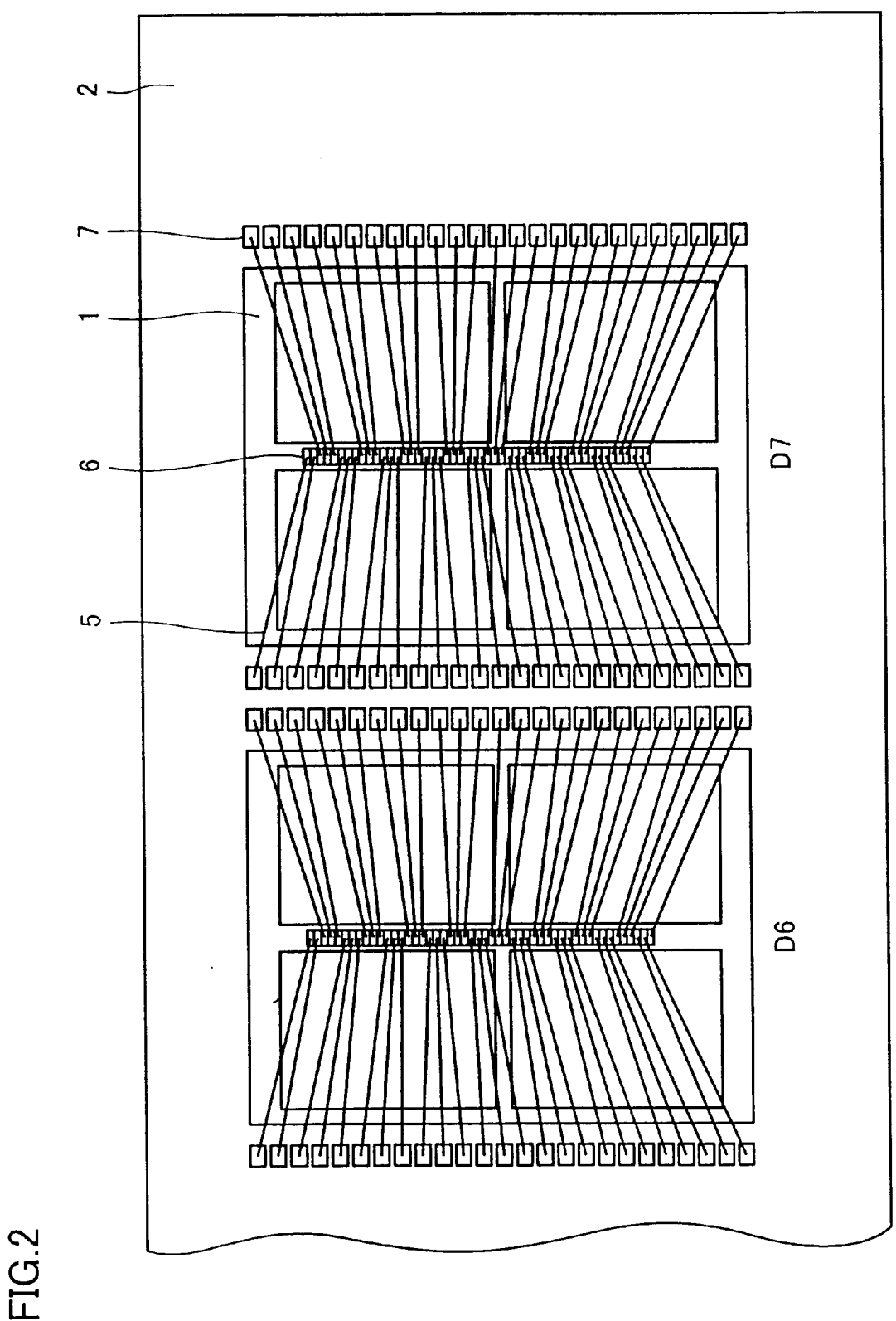
FIG. 2 is a view for describing bare chips mounted on a semiconductor module substrate.

In addition, as shown in FIG. 2, bonding pads 6 provided on bare chips 1 and wiring pads 7 provided on semiconductor module substrate 2 are connected by means of bonding wires 5.

Figure 3:
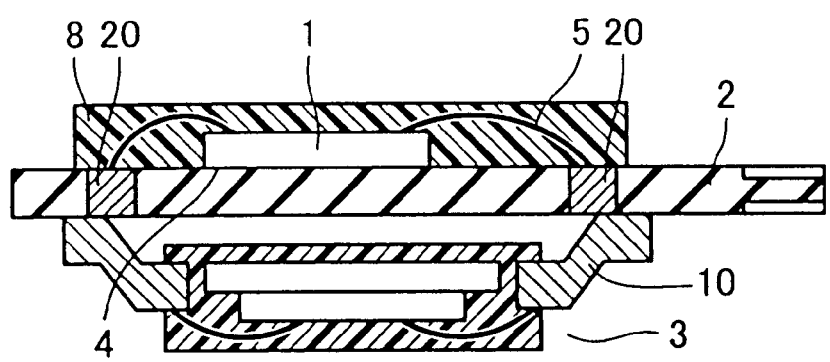
FIG. 3 is a view for describing a cross sectional structure of a bare chip and a repair chip mounted on a semiconductor module substrate.

In addition, the semiconductor module of the embodiment has a structure wherein, in the case that any bare chip(s) 1 from among the plurality of bare chips 1 is or are detected as being defective, as shown in FIG. 3, a good chip(s) 3 used in place of bare chip 1 can be mounted on the rear side of the main surface where the plurality of bare chips 1 are provided.

A bare chip 1 mounted on the surface of semiconductor module 2 and a good chip 3 used as a repair chip in place of this bare chip 1 and mounted on the rear surface utilize common electrical wires, thereby such electrical wires 20 are connected to both the plurality of bare chips 1 mounted on the surface and to good chips 3 mounted in the plurality of repair chip mounting regions on the rear surface, respectively, via through holes that penetrate through semiconductor module substrate 2 in the case that good chips 3 are mounted.

In a manufacturing method for a semiconductor module of the present embodiment, as shown in FIG. 2, after a plurality of bare chips 1 are mounted on a semiconductor module substrate 2, bonding pads 6 provided on bare chips 1 and wire pads 7 provided on semiconductor module substrate 2 are electrically connected by means of bonding wires 5. After that, as shown in FIG. 3, the plurality of bare chips 1 is integrally molded into a mold resin 8, thereby a semiconductor module is completed. Then, after the completion of the semiconductor module, the structure allows for the mounting, if necessary, of a good chip 3 in a mold on the rear surface of semiconductor module substrate 2.

Therefore, in the case that a defective product is detected from among the plurality of bare chips 1 by means of a variety of tests such as a system test after the manufacture of a memory module, which is an example of a semiconductor module, a good chip 3 is mounted on the rear surface of semiconductor module substrate 2 so that the function of a bare chip 1 that has become defective is performed by good chip 3, thereby repair of the semiconductor module becomes possible.

Here, in order for good chip 3 to perform the function of bare chip 1 that has been detected as being defective, it is necessary to turn off the operation of bare chip 1 that has been detected as being defective Therefore, it becomes necessary to control the switching between the condition wherein bare chip 1 functions and the condition wherein bare chip 1 does not function.

In the semiconductor module substrate of the present embodiment, a signal at a predetermined potential is inputted to a terminal that is not utilized at the time of actual utilization the semiconductor module, thereby the ON/OFF switching of the input/output of bare chip 1 mounted on semiconductor module substrate 2 is controlled so that good chip 3 carries out the function of bare chip 1, which has been detected as being defective.

Here, in the semiconductor module of the embodiment, after a plurality of bare chips 1 are mounted on a semiconductor module substrate 2 and bonding pads 6 of bare chips 1 and wiring pads 7 of semiconductor module substrate 2 are electrically connected, the semiconductor module is integrally molded by a mold resin 8. Therefore, the mounting area of the semiconductor module can be reduced.

Figure 4:
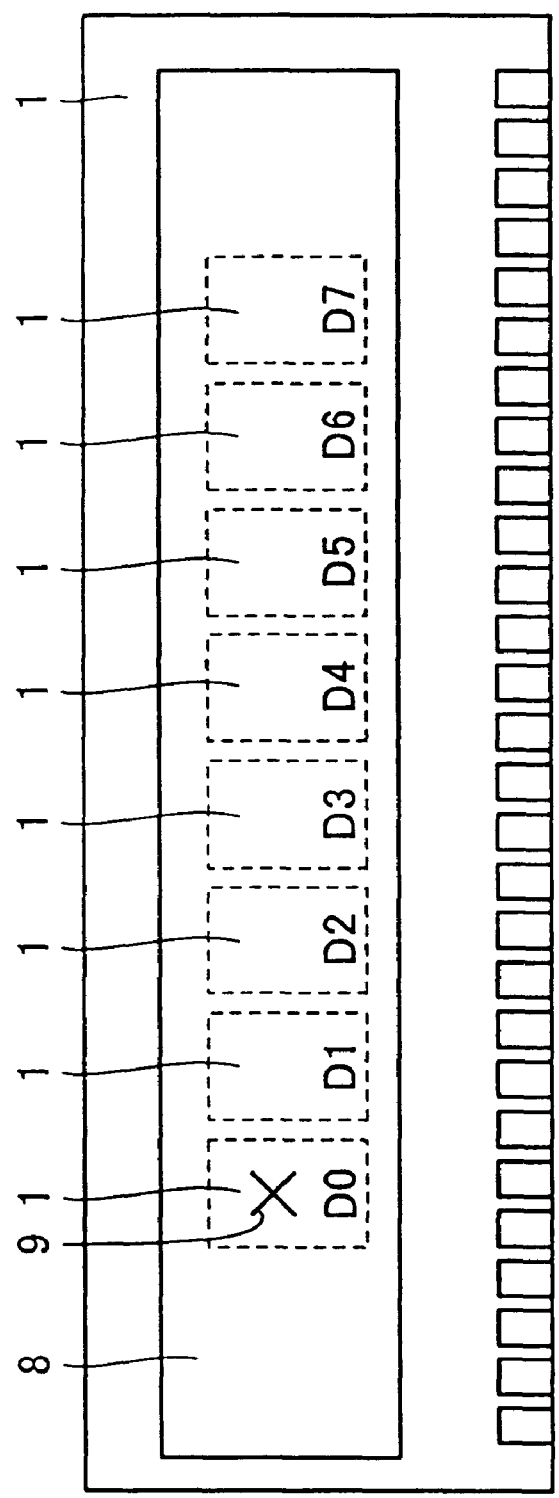
FIG. 4 is a view for describing wherein one of the bare chips mounted on a semiconductor module substrate has become defective.
Figure 5:
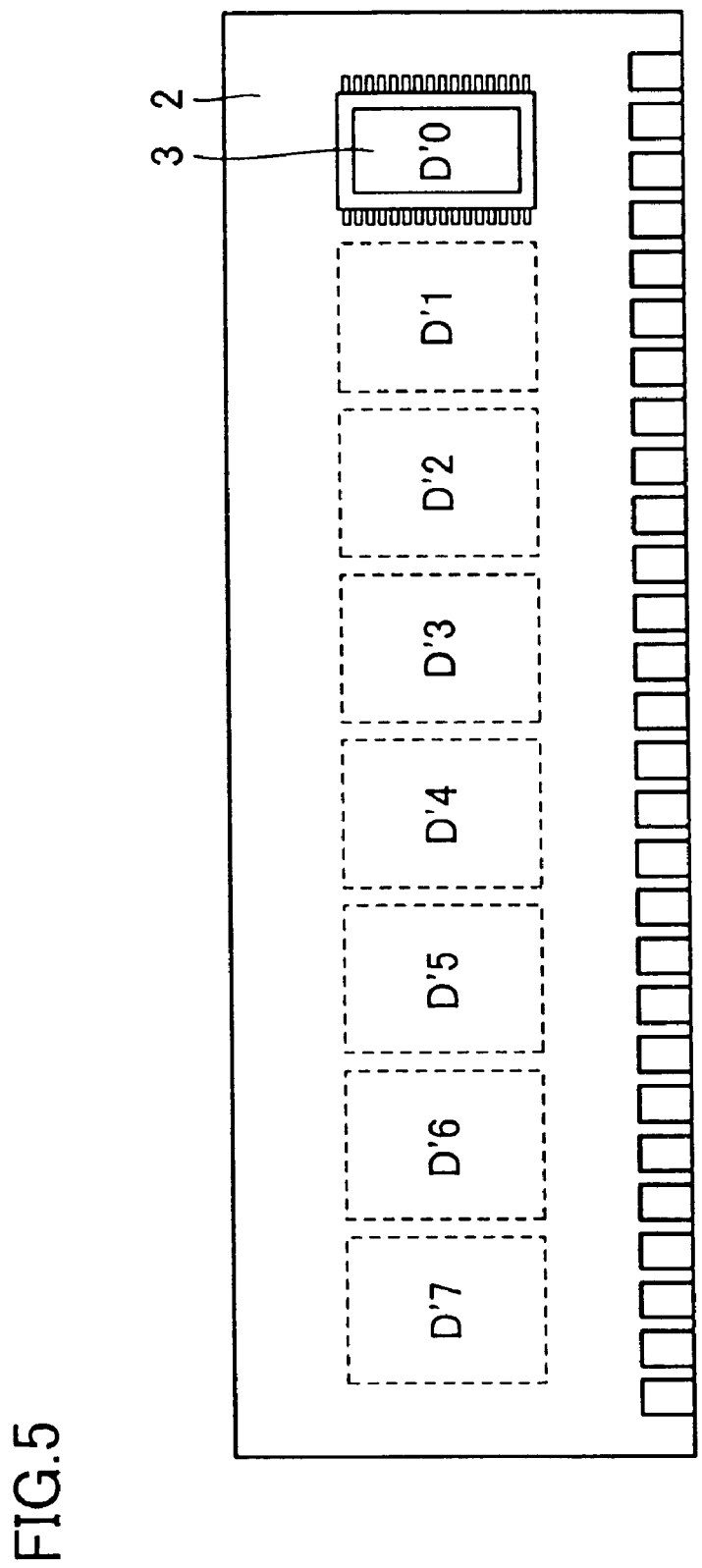
FIG. 5 is a view for describing wherein a semiconductor module is repaired by utilizing a good chip mounted on a rear surface of a semiconductor module substrate.

FIGS. 4 and 5 show a configuration example of a semiconductor module substrate after repair. As shown in FIGS. 4 and 5, bare chips 1 (D0 to D7) are mounted on the surface of a semiconductor module substrate 2 and repair chip mounting regions for good chips 3 (D'0 to D'7) mounted at the time of repair are provided on the rear surface of semiconductor module substrate 2 of the semiconductor module.

Figure 6:
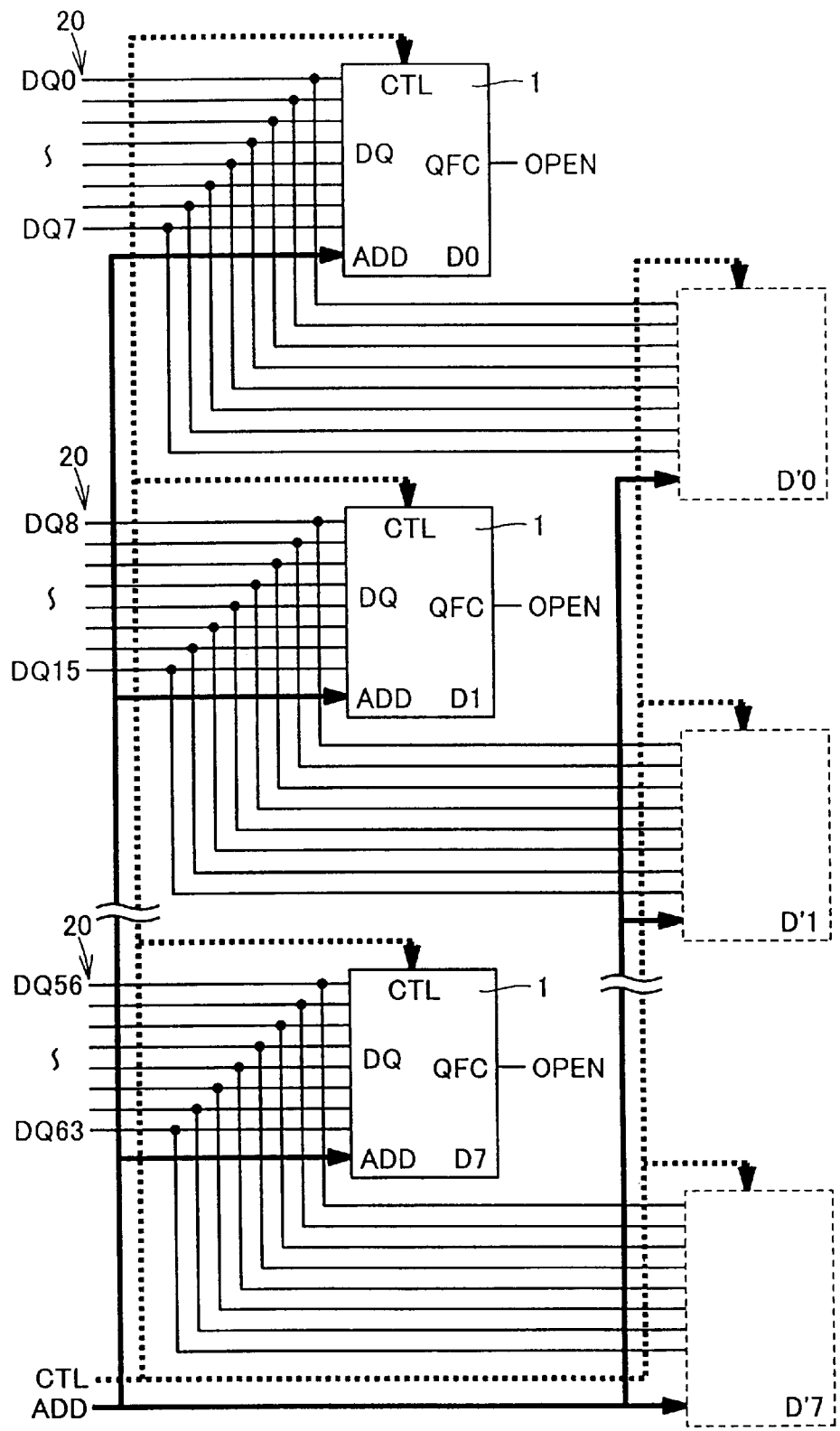
FIG. 6 is a diagram for describing a configuration of a semiconductor module substrate before repair.
Figure 7:
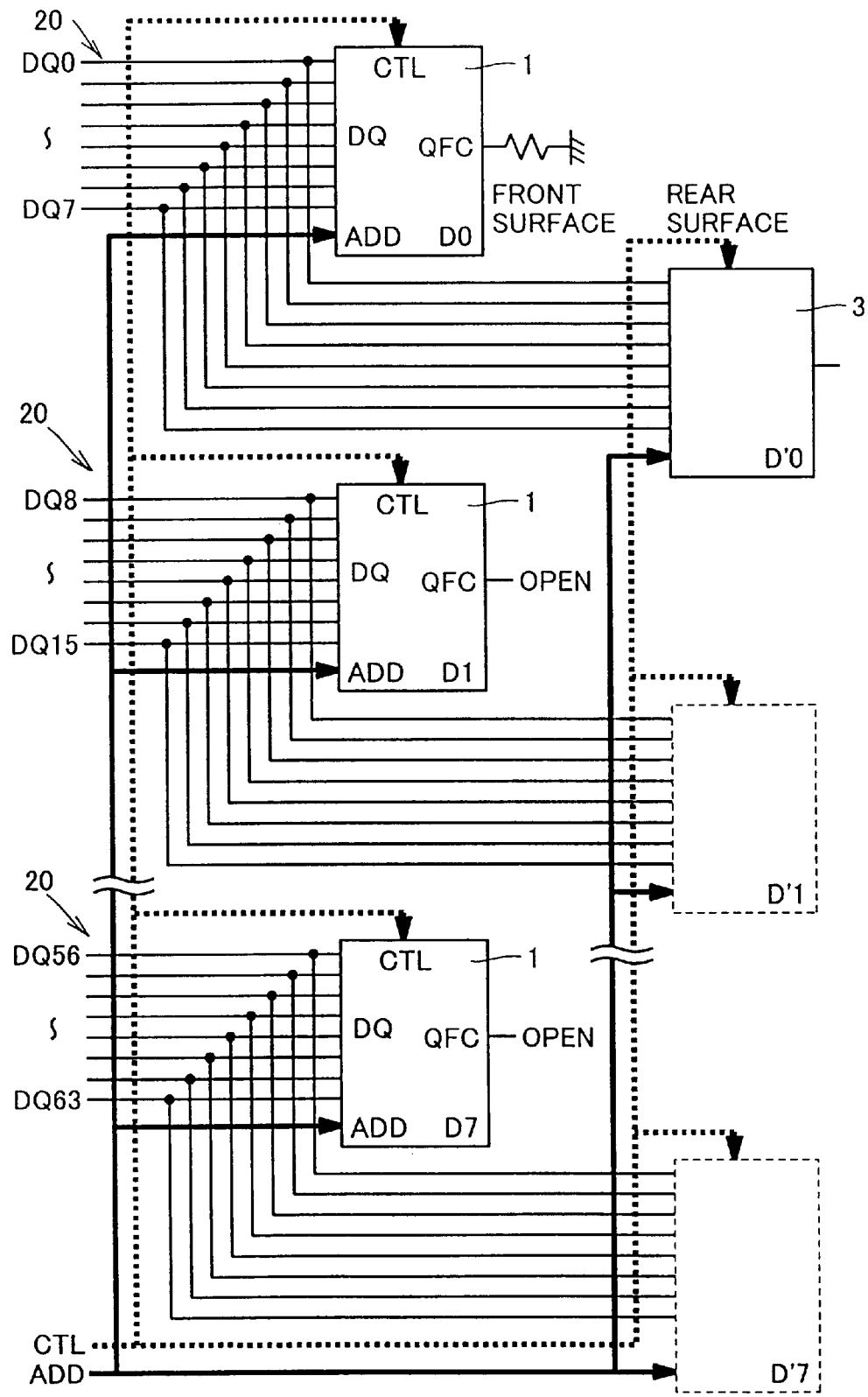
FIG. 7 is a diagram for describing a configuration of a semiconductor module substrate after repair.

FIG. 6 shows a block diagram of the surface of semiconductor module substrate 2 on which bare chips 1 (D0 to D7) are mounted, before repair. As shown in FIG. 6, bare chips 1 (D0 to D7) are provided with QFC pins (not limited to only QFC pins as long as the terminals are not in normal use) for controlling the input/output of bare chip 1, which has been detected as being defective. FIG. 7 shows a block diagram of the front surface and of the rear surface of module substrate 2 on which single good chips 3 (D'0 to D'7) in a mold utilized at the time of repair are mounted. Here, bare chips 1 (D0 to D7) and good chips 3 (D'0 to D'7) utilize input/output terminals DQ0 to DQ63 connected to common electrical wires 20, respectively. Here, input/output terminals DQ0 to DQ63 are connected to other circuits or memories and are terminals for inputting/outputting electrical signals at these other circuits or memories.

Though the semiconductor module configuration before repair shown in FIG. 6 is not problematic because a good chip 3 is not mounted, in the configuration of the semiconductor module after repair shown in FIG. 7, bare chip 1 (D0) and good chip 3 (D'0) utilize input/output terminals DQ0 to DQ63 that are connected to common electrical wires 20 and, therefore, input/output signals of bare chip 1 (D0) and input/output signals crash each other good chip 3 (D'0), so as to cause a problem in the condition wherein both a bare chip 1 (D0) and a good chip 3 (D'0) are in operation.

Therefore, in the semiconductor module of the embodiment, the QFC pin of bare chip 1 detected as being defective is fixed at a predetermined potential so that the input/output of signals from the input/output terminals of this bare chip 1 are disabled and, thereby, the above described problem is prevented from occurring. Here, since the QFC pin has a structure that is exposed to the outside of mold resin 8, it is possible to fix the QFC pin at a predetermined potential from the outside even after bare chip 1 is covered with mold resin 8. In addition, the circuit configuration of the inside of a bare chip 1 is a circuit configuration that does not carry out input/output of electrical signals from the input/output terminals of bare chip 1 when the potential of the QFC pin is fixed at the predetermined potential.

Figure 8:
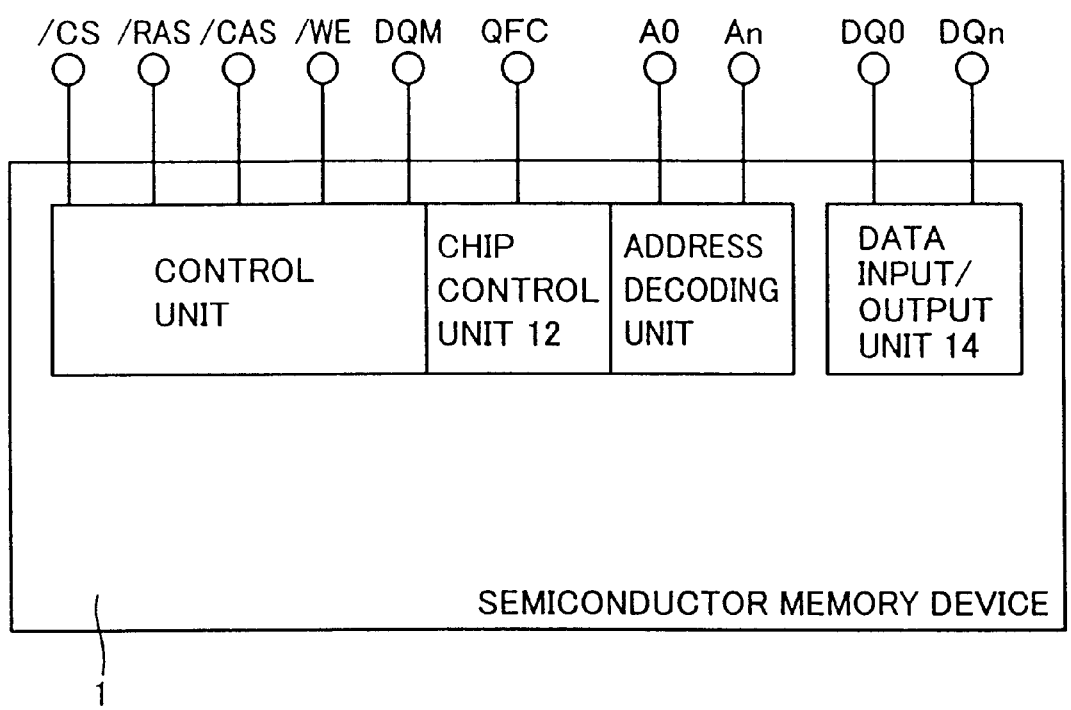
FIG. 8 is a diagram for describing an inside configuration of a semiconductor memory device (bare chip or repair chip)
Figure 9:
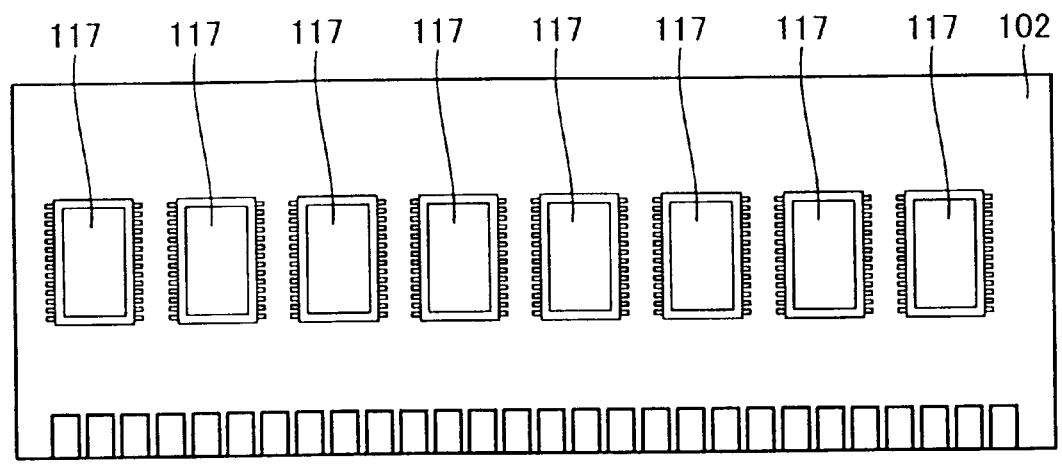
FIG. 9 is a view when viewed from above for describing a configuration of a semiconductor module according to a prior art.
Figure 10:
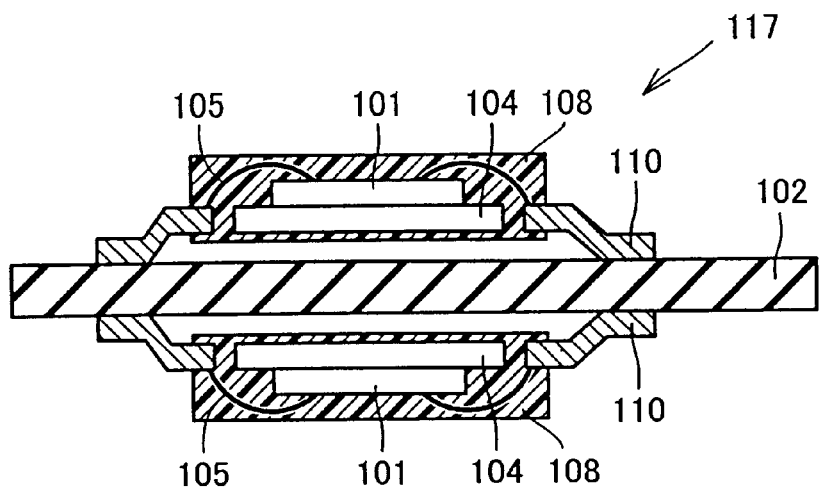
FIG. 10 is a view for describing a cross sectional configuration of the semiconductor module according to the prior art.

For example, as shown in FIG. 6, in the case that a QFC pin is in the OPEN condition, a bare chip 1 (D0 to D7) or a good chip 3 (D'0 to D'7) outputs electrical signals from an input/output unit 14, shown in FIG. 8, to input/output terminals DQ0 to D63 or inputs electrical signals from input/output terminals DQ0 to DQ63 to input/output unit 14, shown in FIG. 8, due to the operation of a chip control unit 12, shown in FIG. 8. In the case that a QFC pin is fixed at the ground potential (GND), a bare chip 1 (D0 to D7) or a good chip 3 (D'0 to D'7) stops the input of signals from input/output terminals DQ or the output of signals from input/output terminals DQ using input/output unit 14, shown in FIG. 8, due to the operation of chip control unit 12, shown in FIG. 8.

Accordingly, in the case that none of bare chips 1 have been detected as being defective, it is not necessary to mount a good chip 3 (D'0 to D'7) and it becomes possible to implement a semiconductor module wherein a plurality of bare chips 1 are directly mounted on a semiconductor module substrate 2. In addition, QFC pins not utilized at the time of the actual operation of the semiconductor module normally are controlled to be in the OPEN condition by means of chip control unit 12 in bare chips 1 (D0 to D7) at the time of operation of the semiconductor device so that the output of signals from bare chip 1 (D0 to D7) to input/output terminals DQ0 to DQ63 is carried out or the input of signals from input/output terminals DQ0 to DQ63 to bare chip 1 (DQ) is carried out.

Furthermore, in the semiconductor module, in the case that a bare chip 1 is detected as being defective from among bare chips 1 (D0 to D7), a good chip(s) 3 (D'0 to D'7) is/are mounted on the rear surface of the surface of semiconductor module substrate 2 on which bare chips 1 are provided and the QFC pin of bare chip 1 (D0) is fixed at the ground potential (GND) and, thereby, bare chip 1 (D0) stops the output of signals to input/output terminals DQ0 to DQ7 and the input of signals from input/output terminals DQ0 to DQ7. Thereby, a good chip 3 (D0) outputs electrical signals to input/output terminals DQ0 to DQ7 or electrical signals are inputted from input/output terminals DQ0 to DQ7. Accordingly, the functions of defective bare chip 1 are taken over (replaced) by good chip 3 so that the semiconductor module can be repaired.

Here, though, as for the semiconductor module of the present embodiment, an example is shown wherein bare chips 1 are mounted on one of the surfaces of semiconductor module substrate 2 while good chips 3 are mounted on the other surface (rear surface), both bare chips and good chips may be mounted on one of the surfaces, alone, of a semiconductor module substrate, so that no chips are mounted on the other side, in the case that a large semiconductor module substrate can be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor module comprising:
   a semiconductor module substrate having first and second opposing main surfaces;
   a plurality of bare chips mounted on the first main surface of the semiconductor module substrate; and
   a mold resin for covering said plurality of bare chips together with the first main surface of said semiconductor module substrate, wherein
   said semiconductor module substrate includes:
      a plurality of repair chip mounting regions provided outside of said mold resin, said repair chip mounting regions are adapted to mount repair chips having input/output terminals; and
      a plurality of electrical wires, said wires adapted to connect to said input/output terminals of a mounted repair chip so that an electrical signal that would have been inputted to or outputted from a defective bare chip can be inputted to or outputted from said mounted repair chip via said input/output terminals, wherein
   each of said plurality of bare chips is formed so that the operation of each of a plurality of defective bare chips can be turned off, and each of said plurality of bare chips is formed so that, if the operation of a defective bare chip is turned off and a repair chip is mounted in a repair chip mounting region, an electrical signal that would have been outputted from said defective bare chip is outputted from said repair chip and an electrical signal that would have been inputted to said defective bare chip is inputted to said repair chip.

2. The semiconductor module according to claim 1, wherein
said repair chip mounting regions are provided on the second main surface of said semiconductor module substrate.

3. The semiconductor module according to claim 2, wherein
said plurality of electrical wires is formed so that a repair chip can be mounted on the second main surface in the vicinity of a region directly beneath the region wherein a defective bare chip is mounted.

4. The semiconductor module according to claim 1, wherein
a pin is provided on said bare chip, and
said bare chip is formed so that it is possible to turn off the operation of said bare chip by fixing the pin at a predetermined potential.

5. The semiconductor module according to claim 4, wherein
said pin is a pin that is not utilized for the input/output of an electrical signal, when said bare chip is not defective.

6. The semiconductor module according to claim 1, wherein
said plurality of electrical wires includes:
a plurality of first electrical wires connected to input/output terminals of said plurality of bare chips, respectively, for allowing electrical signals to be inputted to, or to be outputted from, said plurality of bare chips, respectively; and
a plurality of second electrical wires branched from the plurality of first electrical wires, respectively, and adapted to be connected to input/output terminals of a mounted repair chip that can be mounted on the second main surface so as to allow electrical signals to be inputted to or be outputted from said mounted repair chip.

7. The semiconductor module according to claim 1, wherein said mold resin integrally covers the entirety of said plurality of bare chips.

8. A semiconductor module comprising:
a semiconductor module substrate having first and second opposing main surfaces;
a plurality of bare chips mounted on the first main surface of the semiconductor module substrate, wherein at least one of the plurality of bare chips is defective;
at least one repair chip; and
a mold resin for covering said plurality of bare chips together with the first main surface of said semiconductor module substrate, wherein
said semiconductor module substrate includes:
a plurality of repair chip mounting regions provided outside of said mold resin, said repair chip mounting regions having said at least one repair chip having input/output terminals mounted thereon; and
a plurality of electrical wires, said wires adapted to connect to said input/output terminals of a mounted repair chip so that an electrical signal that would have been inputted to or outputted from a defective bare chip can be inputted to or outputted from said mounted repair chip via said input/output terminals, wherein
each of said plurality of bare chips is formed so that the operation of each of a plurality of defective bare chips can be turned off, and
each of said plurality of bare chips is formed so that, if the operation of a defective bare chip is turned off an electrical signal that would have been outputted from said defective bare chip is outputted from said repair chip and an electrical signal that would have been inputted to said defective bare chip is inputted to said repair chip.

* * * * *